United States Patent [19]

Eisen et al.

[11] 4,157,497

[45] Jun. 5, 1979

[54] QUALIFICATION TEST OF GALLIUM ARSENIDE

[75] Inventors: Fred H. Eisen, Woodland Hills; Ricardo Zucca; Bryant Welch, both of Thousand Oaks, all of Calif.

[73] Assignee: Rockwell International Corporation, El Segundo, Calif.

[21] Appl. No.: 866,975

[22] Filed: Jan. 5, 1978

[51] Int. Cl.$^2$ .............................................. G01R 27/02
[52] U.S. Cl. ...................................... 324/62; 29/574; 324/71 SN; 324/65 R; 324/158 R
[58] Field of Search ................. 324/62, 71 SN, 65 R, 324/158 R, 158 D; 29/574; 148/1.5

[56] References Cited

U.S. PATENT DOCUMENTS 3,290,179  12/1966  Goulding .................... 324/71 SN
4,058,413  11/1977  Wilch et al. ........................ 148/1.5

OTHER PUBLICATIONS

Guseva et al., Investigation of the Hall Effect in p-Type Semiconducting Diamond Doped With Boron by the Ion Implantation Method, Soviet Physics, Semiconductors, vol. 4, No. 1, Jul. 1970, pp. 12-16.
Oosthoek et al., The Thermal Properties of High Value Gallium and Boron Implanted Resistors in Silicon, European Conference on Ion Implantation, Sep. 7-9, 1970, pp. 88-91.
Cahen et al., A New Method for Fast Measurement of Ion Implantation Profiles, European Conference on Ion Implantation, Sep. 7-9, 1970, p. 192.
Sealy, An Examination of Tellurium Ion-Implanted GaAs by Transmission Electron Microscopy, Journal of Materials Science, 1975, pp. 683-691.

*Primary Examiner*—Stanley T. Krawczewicz
*Attorney, Agent, or Firm*—L. Lee Humphries; Craig O. Malin

[57] ABSTRACT

Semi-insulating GaAs material is qualified for ion implantation by taking a sample or samples from the material to be evaluated, polishing a surface of the sample, and chemically etching the surface to remove mechanical damage. The surface is bombarded with ions of an inert gas such as krypton, helium, argon, neon, or xenon. After bombardment, the sample is annealed and the sheet resistance is measured to determine if it meets a predetermined acceptable value.

7 Claims, No Drawings

QUALIFICATION TEST OF GALLIUM ARSENIDE

BACKGROUND OF THE INVENTION

A. Field of the Invention

This invention relates to the field of solid state electronics, and particularly to the fabrication of solid state electronic devices from GaAs.

B. Description of the Prior Art

GaAs is a semiconducting compound which has a higher electron mobility than the semiconducting element silicon. This property plus the availability of high reistivity (semi-insulating) GaAs substrates offers the potential of providing integrated circuits having higher speeds and lower power requirements than the presently used silicon integrated circuits. However, the fabrication of devices from GaAs has proved to be a difficult problem, and it has not been possible to simply adopt the highly developed art of fabricating silicon integrated circuits to the fabrication of GaAs integrated circuits.

Previous GaAs integrated circuits have used the depletion-mode, GaAs MESFET mesa fabrication technology. Basic limitations of the mesa technique, such as the use of epitaxial layers or single implants, prevent the realization of high density, high yield, small geometry GaAs devices and integrated circuits.

Ion implantation has been utilized as a technique for implanting dopants into a GaAs substrate, see for example U.S. Pat. No. 3,914,784, entitled, "Ion Implanted Gallium Arsenide Semiconductor Devices Fabricated in Semi-Insulating Gallium Arsenide Substrates" to Hunsperger, et al. However, reproducibility of the implanted profiles is poor, particularly for low dose implants. Consequently, ion implantation has not been satisfactory for reliably fabricating integrated circuits in GaAs.

SUMMARY OF THE INVENTION

It is an object of the invention to provide a method for improving the ion implantation of GaAs substrates.

It is a further object of the invention to provide a method for making the ion implantation of GaAs substrates more reproducible.

It is a further object of the invention to provide a method for qualifying GaAs semi-insulating substrate for ion implantation.

It is a further object of the invention to provide a GaAs substrate which is qualified for ion implantation.

According to the invention, semi-insulating GaAs material is qualified for ion implantation by taking a sample or samples from the material to be evaluated, polishing a surface of the sample, and chemically etching the surface to remove mechanical damage. The surface is bombarded with ions of an inert gas such as krypton, helium, argon, neon, or xenon. After bombardment, the sample is annealed and the sheet resistance is measured to determine if it meets a predetermined acceptable value.

These and other objects and features of the present invention will be apparent from the following detailed description.

DESCRIPTION OF THE PREFERRED EMBODIMENT

Ion implantation is a process by which a chemical species, or dopant, is introduced into a material. In solid state electronics, this process is used to dope a semiconductive material such as silicon or GaAs and thus change the electrical properties of the material, particularly the charge carrier concentration. By selectively changing the carrier concentration, electrical devices can be fabricated in the substrate. Typical dopants which are used in GaAs include sulfur, selenium, and tellurium.

In order for ion implantation to be used successfully to fabricate integrated circuits, it is essential that predictable, reproducible results be obtained. Until the present invention, it has not been possible to obtain such reproducible results in GaAs substrates. In some cases, the doping produced by ion implantation corresponds to that expected from the implanted dopant, whereas in other cases the doping is substantially and unpredictably different.

In work leading to the present invention, it was discovered that such variations in reproducibility were caused, to a substantial degree, by variations in the quality of the substrate material. The cause of these variations in substrate quality is not yet known. However, a relatively simple test has been invented to use in determining whether or not a particular substrate will be satisfactory for ion implantation.

A representative sample of material is cut from a GaAs boule. Preferably, wafers are cut from both ends of the boule to use as samples. One side of each wafer is lapped, polished, and chemically etched to remove any mechanical damage. The prepared substrate is then bombarded with an inert gas to simulate the disorder introduced during the implantation of the dopant. The atomic mass of the gas used, its energy and dose should be similar to those that will be used in the implantation process for which the substrate is being tested. The bombarded sample is then capped and annealed at the same temperature as is used for the annealing of doped samples (generally for ½ hour at 800 to 900° C.). Finally, the sheet resistance and/or other electrical properties of interest are measured. The material remaining in the boule is qualified for implantation if the samples meet the electrical specifications dictated by the application for which it is being tested.

The following is a specific example of a test used to qualify a boule of GaAs for use in fabricating FET's or integrated circuits using the implantation of Se by ion bombardment:

Two wafers are cut, one from the front and one from the back of a GaAs boule. One side of each wafer is lapped and polished in a known manner. The wafers are then chemically etched to remove any mechanical damage which may have been introduced into the wafer by the lapping and polishing. Various suitable etchants are known, one being a mixture of 3 parts of $H_2SO_4$, 1 part of $H_2O_2$, and 1 part of water.

The prepared samples are placed in the sample chamber of a 400 KV Van de Graff accelerator. They are bombarded with a dose of $3 \times 10^{12}$ krypton ions/cm$^2$ at an energy of 300 KeV at 200° C.

The bombarded samples are removed from the accelerator and a silicon nitride ($Si_3N_4$) cap is sputtered on the surface in a known manner to protect the surface during a subsequent anneal. The capped samples are annealed by heating them at 800°–900° C. for ½ hour in hydrogen-purged furnace.

After cooling of the samples, the silicon nitride cap is removed by etching with hydrofluoric acid.

The quality of the substrate is then determined by measuring its sheet resistance by the Van der Pauw method using gold-germanium (or other suitable) ohmic contacts. The Van der Pauw method is a standard, well-known method in the semi-conductor art for measuring sheet resistance, and is described in Phillip's Research Reports 13, 1-9, 1958. A typical 25 mil slice of untreated GaAs has a sheet resistance of from $10^{10}$ to $10^{11}$ $\Omega/\square$. After qualification testing, as described above, both wafers should have a sheet resistance of at least $10^7$ $\Omega/\square$ in order to be acceptable for fabrication into FET's or integrated circuits. Material meeting such a requirement can be used to consistantly fabricate such devices provided that other variables in the process are kept in proper control.

The dosage of krypton and its energy can be varied as desired to simulate the actual conditions of selenium implantation. However, it is not necessary to simulate closely the actual implantation conditions during qualification provided that a level of sensitivity suitable for the particular application is established.

Other neutral gases such as He, A, Ne, and Xe can be used for bombardment. The particular gas used should be selected to match, as closely as possible, the mass of the dopant material. For example, argon can be used to simulate the effect of a sulfur implant and xenon the effect of a tellurium implant.

Numerous variations and modifications may be made without departing from the present invention. Accordingly, it should be clearly understood that the form of the present invention described above is illustrative only and is not intended to limit the scope of the present invention.

What is claimed is:

1. A method of qualifying GaAs semi-insulating substrate for ion implantation comprising the steps of:
   providing a semi-insulating, GaAs substrate;
   bombarding said substrate with inert gas ions selected from the group consisting of krypton, helium, argon, neon, and xenon;
   annealing the bombarded substrate; and
   measuring a predetermined electrical property of the bombarded substrate to determine if it meets a predetermined value.

2. The method as claimed in claim 1, wherein said step of providing a substrate comprises;
   taking a sample from an end of a GaAs boule;
   polishing at least one surface of said sample; and
   removing mechanical damage from the polished surface by chemically etching said surface.

3. The method as claimed in claim 2, wherein said step of annealing comprises:
   providing a means for protecting said surface during heating; and
   heating said surface at 800° to 900° C. for approximately one half-hour.

4. The method as claimed in claim 3, wherein step of providing a means for protecting said surface comprises providing a $Si_3N_4$ cap on said surface.

5. The method as claimed in claim 1, wherein said step of measuring a predetermined electrical property of said bombarded substrate comprises measuring the sheet resistance of said bombarded substrate.

6. The method as claimed in claim 5, wherein said step of measuring the sheet resistance of said bombarded substrate is accomplished by utilizing the Van der Pauw method.

7. A method of qualifying GaAs semi-insulating substrate for ion implantation comprising the steps of:
   providing a semi-insulating, GaAs substrate;
   bombarding said substrate with inert gas ions selected from the group consisting of krypton, helium, argon, neon, and xenon;
   providing a $Si_3N_4$ cap on a surface of said substrate to protect said surface;
   heating said substrate at 800° to 900° C. for approximately one half-hour; and
   measuring the sheet resistance of said bombarded substrate by the Van der Pauw method.

* * * * *